United States Patent
Swanson et al.

(10) Patent No.: US 8,427,249 B1
(45) Date of Patent: Apr. 23, 2013

(54) RESONATOR WITH REDUCED ACCELERATION SENSITIVITY AND PHASE NOISE USING TIME DOMAIN SWITCH

(75) Inventors: Paul D. Swanson, Santee, CA (US); Richard L. Waters, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 62 days.

(21) Appl. No.: 13/276,948

(22) Filed: Oct. 19, 2011

(51) Int. Cl.
*H03B 5/30* (2006.01)
*H01L 41/053* (2006.01)

(52) U.S. Cl.
USPC ............... 331/154; 331/46; 331/65; 331/165; 73/1.37; 310/348

(58) Field of Classification Search ............... 73/1.37, 73/1.38, 1.41, 514.01, 514.16, 514.26, 514.27, 73/514.29, 514.32, 514.34, 514.35, 514.38; 310/348; 324/76.11; 331/46, 65, 68, 154, 331/165, 187
See application file for complete search history.

(56) References Cited

U.S. PATENT DOCUMENTS

| | | | |
|---|---|---|---|
| 5,023,503 A | 6/1991 | Legge et al. | |
| 6,584,864 B2 * | 7/2003 | Greenwood | 73/862.59 |
| 6,718,825 B1 * | 4/2004 | Platt et al. | 73/514.32 |
| 6,859,113 B2 * | 2/2005 | Giousouf et al. | 331/154 |
| 7,332,849 B2 * | 2/2008 | Ling et al. | 310/331 |
| 7,915,965 B2 * | 3/2011 | Hardy et al. | 331/65 |
| 8,188,800 B2 * | 5/2012 | Fry et al. | 331/162 |
| 2008/0000296 A1 * | 1/2008 | Johnson | 73/514.18 |
| 2010/0116630 A1 | 5/2010 | Pinkerton | |

OTHER PUBLICATIONS

Unpublished U.S. Appl. No. 13/168,603, filed Jun. 24, 2011, Titled "Apparatus and Methods for Time Domain Measurement of Oscillation Perturbations," by Paul D. Swanson et al.

* cited by examiner

*Primary Examiner* — Levi Gannon
(74) *Attorney, Agent, or Firm* — Kyle Eppele; J. Eric Anderson

(57) ABSTRACT

A resonator comprising: a frame; a first oscillator configured to oscillate with respect to the frame; a first driver configured to drive the first oscillator at the first oscillator's resonant frequency; a first half of a first relative position switch mounted to the first oscillator; a second oscillator having substantially the same resonant frequency as the first oscillator, wherein the first and second oscillators are designed to respond in substantially the same manner to external perturbations to the frame; a second half of the first relative position switch mounted to the second oscillator; and wherein as the first oscillator oscillates there is relative motion between the first and second oscillators such that the first relative position switch passes through a closed state in each oscillation when the first and second switch halves pass by each other.

19 Claims, 17 Drawing Sheets

RESONATOR WITH REDUCED ACCELERATION SENSITIVITY AND PHASE NOISE USING TIME DOMAIN SWITCH

FEDERALLY-SPONSORED RESEARCH AND DEVELOPMENT

This invention is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 100869.

BACKGROUND OF THE INVENTION

Existing resonators employ a variety of physical mechanisms to create usable resonance for timing applications. Examples include structural mode resonance and bulk acoustic wave resonance for example. Existing technologies, however, all suffer in timing accuracy due to sensitivities to external vibrations (i.e., perturbations, accelerations, etc.) and contain a time-dependent phase noise. These drawbacks reduce the accuracy and usefulness of resonators for timing applications either as discrete components or embedded within existing electronic circuitry fabricated on a semiconducting substrate for example. Phase noise, or jitter of the output resonator frequency, can be due to the capacitive method of sensing the resonance thus resulting in a sinusoidal output. This sinusoidal output can be noisy in nature due to noise introduced by the transduction technique, for example. When a noise sinusoidal output is fed back into the resonator via a phase-locked loop (PLL) or delay-locked loop (DLL) control loop the result is instability in the feedback circuitry. In addition, because the signals are measured capacitively or based on the piezoelectric effect they can be sensitive to external vibrations or anything that may cause a time-dependent deformation of the resonant mode-shape, frequency or phase of the signal. Current resonators lack effective means to independently measure or cancel-out this environmental noise contribution.

SUMMARY

Described herein are several embodiments of a robust, low-cost and high resolution dual oscillator resonator, and methods of implementing and using the same. One embodiment of the resonator is disclosed which comprises a frame, first and second oscillators, first and second relative position switch halves, and a driver. The first oscillator is configured to oscillate with respect to the frame and the first driver is configured to drive the first oscillator at the first oscillator's resonant frequency. The first and second oscillators have substantially the same resonant frequency and are designed to respond in substantially the same manner to external perturbations to the frame. The first and second halves of the relative position switch are mounted to the first and second oscillators respectively. As the first oscillator oscillates there is relative motion between the first and second oscillators such that the relative position switch passes through a closed state in each oscillation when the first and second switch halves pass by each other.

Also described herein is a method for providing a resonator with a time domain switch. The method begins by providing a frame and configuring a first oscillator to oscillate with respect to the frame. Next the first oscillator is driven at the first oscillator's resonant frequency. In other steps, a first half of a relative position switch is mounted to the first oscillator and a second oscillator is provided which has substantially the same resonant frequency as the first oscillator. The first and second oscillators are designed to respond in substantially the same manner to external perturbations to the frame. When the first oscillator oscillates there is relative motion between the first and second oscillators. A second half of the relative position switch is mounted to the second oscillator such that as the first and second switch halves pass by each other in each oscillation the relative position switch passes through a closed state. Then a period of oscillation is determined as the difference between successive closed states of the relative position switch.

BRIEF DESCRIPTION OF THE DRAWINGS

Throughout the several views, like elements are referenced using like references. The elements in the figures are not drawn to scale and some dimensions are exaggerated for clarity. As used herein, the terms "top," "bottom," "side," "up," "down," "left," "right," and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

DETAILED DESCRIPTION OF EMBODIMENTS

Figure 1:
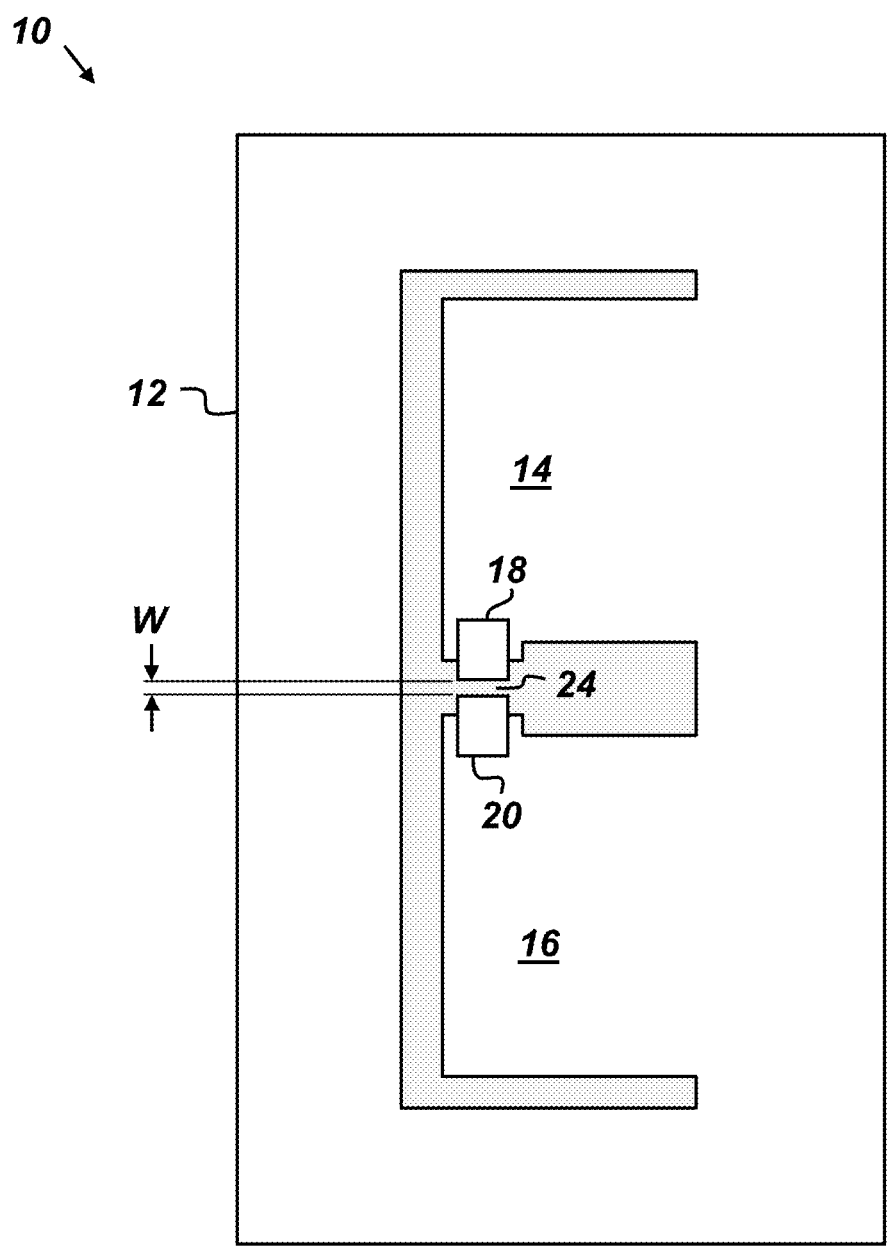
FIG. 1 is a top view of an embodiment of a resonator.

FIG. 1 depicts a top view of an embodiment of a resonator 10 that has reduced phase noise and minimal sensitivity to external perturbations and/or other phenomena. The resonator 10 comprises a frame 12, first and second oscillators 14 and 16 respectively, first and second relative position switch halves 18 and 20 respectively, and a driver 22 (shown in FIGS. 2A-2C). The driver 22 is configured to drive the first oscillator 14 at the first oscillator's resonant frequency. The resonator 10 is configured such that when the first oscillator 14 oscillates with respect to the frame 12 there is relative motion between the first and second oscillators 14 and 16. The first and second relative position switch halves 18 and 20 are mounted to the first and second oscillators 14 and 16 respectively in any configuration such that during each oscillation of the first oscillator 14 the relative position switch passes through a closed state when the first and second relative position switch halves 18 and 20 pass by each other. The first and second oscillators 14 and 16, which have substantially the same resonant frequency, are designed to respond in substantially the same manner to external perturbations to the frame 12.

Figure 2A:
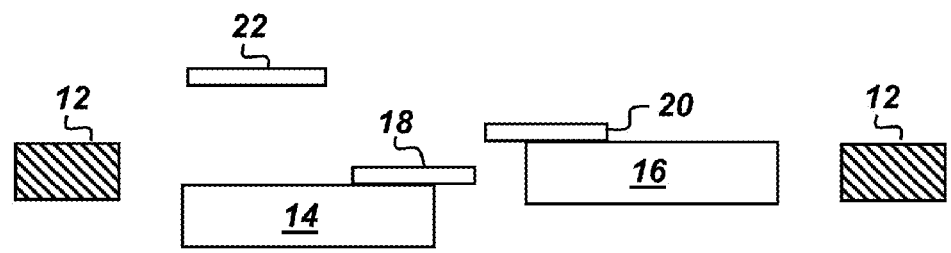
FIG. 2A is a side view of an embodiment of a resonator showing deflection of oscillators.
Figure 2B:
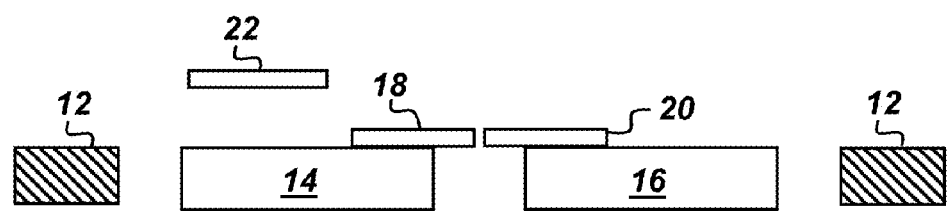
FIG. 2B is a side view of an embodiment of a resonator showing aligned oscillators.
Figure 2C:
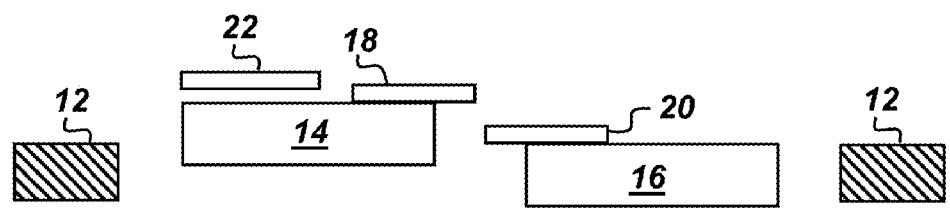
FIG. 2C is a side view of an embodiment of a resonator showing deflection of oscillators.

FIGS. 2A-2C are side/cross-sectional views of one embodiment of the resonator 10 showing various possible positions of the first oscillator 14 as it oscillates with respect to the frame 12. FIG. 2B depicts the first and second relative position switch halves 18 and 20 in the closed state. FIGS. 2A and 2C depict the first and second relative position switch halves 18 and 20 in an open state. FIGS. 2A-2C also show an embodiment of the driver 22 where the driver 22 is an electrode positioned above the first oscillator 14.

The frame 12 may have any desired size and/or shape and may have any structure that is capable of supporting the first and second oscillators 14 and 16. For example, in one embodiment, the resonator 10 and its components may all be monolithically manufactured as a micro-electro-mechanical system (MEMS). Suitable materials out of which the frame may be constructed include, but are not limited to, silicon, Gallium Arsenide (GaAs), and other semiconductor materials, as well as quartz, PZT, and other piezoelectric materials.

It is to be understood that the first and second oscillators 14 and 16, while depicted in FIGS. 1 and 2A-2C as cantilever spring elements, may be coupled to the frame 12 in any way that allows them to oscillate with respect to the frame 12 such that there is relative motion between the first and second oscillators 14 and 16. As used herein, the terms "oscillator" refers generally, and without limitation, to an assembly configured for periodic or aperiodic displacement with respect to a reference position. Suitable examples of the first and second oscillators 14 and 16 include, but are not limited to, clamped-clamped beam resonators, tuning fork resonators, asymmetric resonators, symmetrically anchored resonators, bulk disk resonators, and lateral-mode resonators. One or both of the first and second oscillators 14 and 16 may be driven. In one alternative embodiment, where the first and second oscillators 14 and 16 are both driven to resonate at their resonant frequencies, both resonators may be locked 180 degrees out of phase with one another. In another embodiment, only the first oscillator 14 is driven by the driver 22 to oscillate at its resonant frequency and the second oscillator 16 remains substantially stationary except for external perturbations and vibrations from the first oscillator 14 which are communicated through the frame 12 to the second resonator 16.

In the embodiment of the resonator 10 shown in FIGS. 1 and 2A-2C, the first and second relative position switch halves 18 and 20 are thin planar scanning tunneling microscopy (STM) tips fabricated on the edges of the first and second oscillators 14 and 16. However, it is to be understood that the relative position switch halves 18 and 20 may be any two elements capable of generating a detectable impulse or change in reference during each oscillation as the first and second relative position switch halves 18 and 20 pass by each other. The purpose of the relative position switch is to localize the position of the first and second oscillators 14 and 16 such that an accurate acceleration-independent phase measurement can be performed thereby increasing stability of a phased-locked loop closure and reducing overall phase noise and jitter of the resonator 10. In the embodiment of the resonator 10 where the relative position switch is an electron tunneling switch a finite width pulse is generated. The current pulse itself can be amplified to the rails via a transimpedance amplifier and the leading and or trailing edges of the pulse used to localize the position and provide information with regards to the time dependent position of the resonator, as is described more fully with respect to FIGS. 6A and 6B and Table 1 below. The relative position switch may also be a capacitive switch, which would work by generating a time-dependent charge as the first and second relative position switch halves 18 and 20 change overlap area with one another. This change can be integrated and amplified to the rails in a similar fashion as the tunneling current previously described. Other switches could be used such as optical shuttering between a light source and a detector or magnetic switches disposed on the first and second oscillators 14 and 16. The relative position switch may also function by sensing the field emission of electrons or the thermionic emission between the first and second relative position switch halves 18 and 20. As an alternative embodiment, an optical light source may be used to provide photo-assisted tunneling to enhance tunneling currents or thermionic currents in the relative position switch. To save power the light source could be pulsed synchronously with the resonant frequency such that light is only emitted during a period of time in which the first and second relative position switch halves 18 and 20 are aligned or are close to being in alignment.

Continuing now with the embodiment of the resonator 10 where the first and second relative position switch halves 18 and 20 are thin planar STM tips such as is shown in FIGS. 1 and 2A-2B, when the relative position switch is in the closed state, the first and second relative position switch halves 18 and 20 are separated by a narrow gap 24 which represents a high potential region. Any differential voltage on the first relative position switch half 18 should produce a pulse of current when it passes a grounded conductive plane of the second relative position switch half 20. Only when the first and second oscillators 14 and 16 pass one another during the closed state of the relative position switch as shown in FIG. 2B would current "tunnel" across the gap 24. The width W of the gap 24 may be, but is not limited to, less than ten angstroms. This configuration (i.e. tip-to-tip and/or edge to edge) differs from other typical STM configurations where current "tunnels" between a charged planar surface of atoms and a point tip.

The driver 22 may be any device capable of driving the first oscillator 14 to oscillate with respect to the frame 12. For example, the driver 22 may be a driving circuit which provides a driving signal configured to induce the oscillatory motion in the first oscillator 14, which, in turn, displaces the first switch half 18 with respect to the second half 20. Another suitable example of the driver 22 includes, but is not limited to, an electrode positioned above and below the first oscillator 14, such as is shown in FIGS. 2A-2C. The first oscillator 14 may also be driven by a constant electrical signal generated through feedback circuitry to maintain resonant oscillation. Yet another example of the driver 22 includes a device for applying a short duration electrical voltage to an electrode positioned either above or below the first oscillator 14. In one approach, the driving signal from the driver 22 includes a time-gated (or "pinged") signal that is turned on and off (e.g., periodically). In other words, the oscillation of the oscillator 14 is caused by using a stepped electrostatic force to initiate harmonic oscillation. The electrostatic force is short in duration compared to the resonant frequency of the oscillator 14 thus providing a "pushing" reinforcement that keeps the oscillator 14 in resonance. This force is periodically repeated as necessary to ensure that the amplitude of the oscillator stays above a minimum value at which point another electrostatic pulse or "ping" is applied. In another approach, the first oscillator 14 is driven in a continuous fashion, such as via a time-varying wave function. The driver 22 could also comprise a piezoelectric transducer deposited on a cantilever spring embodiment of the resonator 10.

The resonator 10 is configured to provide digital (time-based) output, rather than an analog signal output. Such configuration ensures that the accuracy of the resonator 10 is only dependent on the consistency of the triggering events, the nature of the oscillation (whether harmonic, or alternatively non-harmonic), and the accuracy of the time measurement of adjacent triggered events. Since the triggering events are based on the physical dimensions established during fabrication, the proposed design advantageously does not require continuing calibration; i.e., is "self calibrating".

Resonators that rely on time-varying displacement of a mass at a characteristic frequency can be modeled as mass-spring systems. Accordingly, such systems are subject to external accelerations and forces, which can perturb the accuracy of the phase and periodicity of the resonance—thereby impacting the closed-loop control circuitry. This situation leads to an acceleration-dependence for all MEMS-based resonators. The resonator 10 addresses these shortcomings. In classical mechanics, a harmonic oscillator is a system that, when displaced from its equilibrium position, experiences a restoring force F that is proportional to the displacement x as:

$$F = -kx.$$ (Eqn. 1)

If the restoring force is the only force acting on the oscillator system, the system is referred to as a simple harmonic oscillator, and it undergoes simple harmonic motion, characterized by sinusoidal oscillations about the equilibrium point, with constant amplitude and constant frequency $f_0$ (which does not depend on the amplitude):

$$f_0 = \frac{1}{T_0} = \frac{1}{2\pi}\sqrt{\frac{k}{m}}.$$ (Eqn. 2)

where:
k is the spring constant;
m is the oscillator mass
$f_0$ is the oscillator resonant frequency; and
$T_0$ is the corresponding period of oscillations.

Figure 3A:
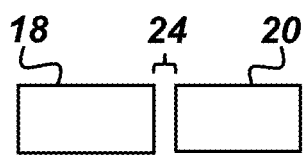
FIGS. 3A-3D are top views of various embodiments of electron tunneling tips.
Figure 3B:
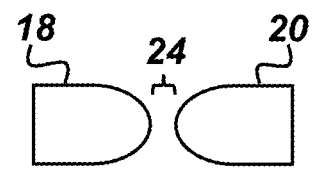
Figure 3C:
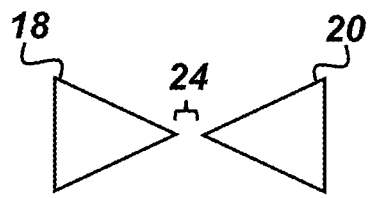
Figure 3D:
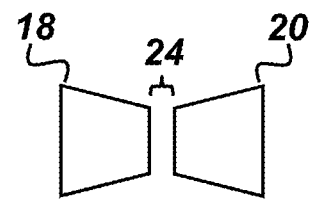

FIGS. 3A-3D show various example embodiments of first and second relative position switch halves 18 and 20 as electron tunneling tips. When the first switch half 18 is aligned with the second switch half 20, a trigger signal may be generated by a sensing circuit, indicating a closed switch state. In one exemplary implementation, two electron tunneling electrodes (one fixed to each of the first and second oscillators 14 and 16) are used as the two switch halves and the signal includes a tunneling discharge pulse caused by the close proximity of electrode tips when the electrodes are aligned in the closed switch position. FIG. 3A depicts rectangular tips. FIG. 3B depicts circular tips. FIG. 3C depicts triangular tips. FIG. 3D depicts isosceles trapezoidal tips. However, it is to be understood that in the embodiment of the resonator 10 where the first and second relative position switch halves 18 and 20 are electron tunneling tips, the shape of the tunneling tips may be anything that produces a geometric field enhancement or that increases the tunneling area.

Figure 4A:
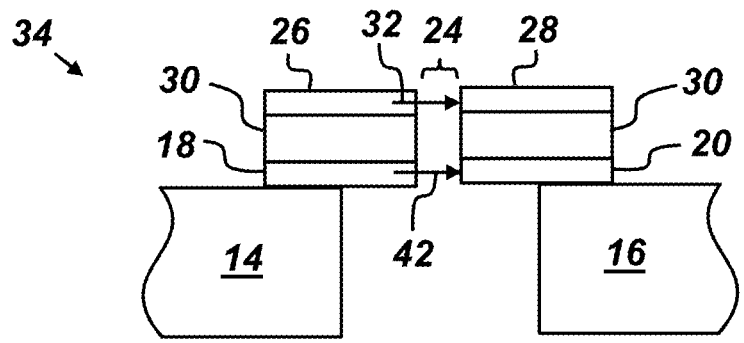
FIGS. 4A-4C are side views of an embodiment of a resonator having stacked relative position switch halves.
Figure 4B:
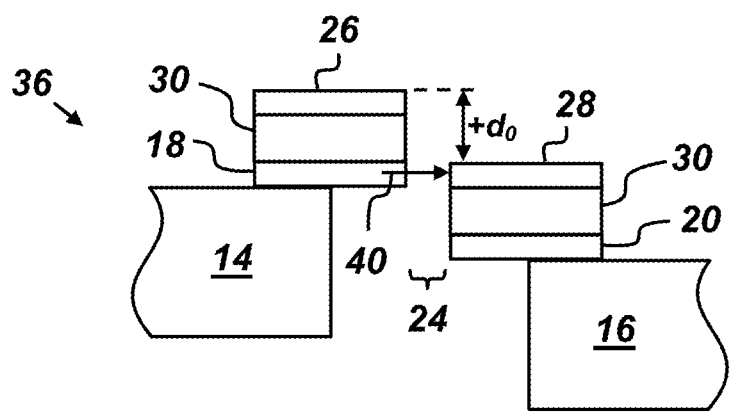
Figure 4C:
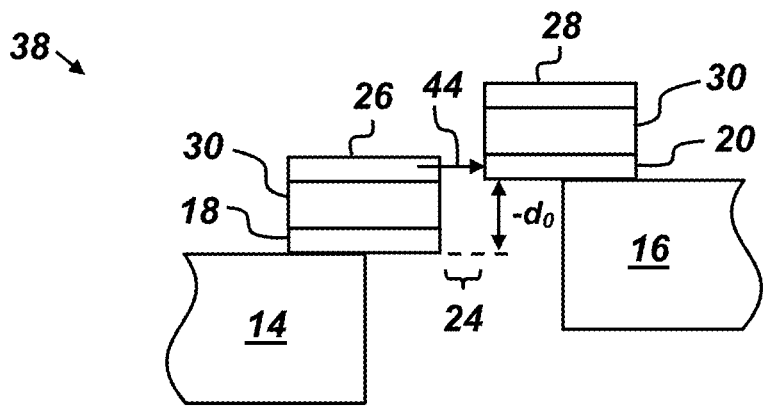

FIGS. 4A-4C show side-view illustrations of multiple relative position switches stacked on top of one another, wherein the first and second oscillators 14 and 16 are in various trigger positions. FIGS. 4A-4C show third and fourth relative position switch halves 26 and 28 stacked on top of the first and second relative position switch halves 18 and 20 respectively. The stacked switch halves are separated by a dielectric material 30. Standard monolithic printed circuit fabrication techniques may be used to fabricate this embodiment of the resonator 10. For every oscillation cycle of the oscillator 14, whenever the relative position switch halves 18, 20, 26, and 28 pass through any of the three trigger positions, tunneling discharge current pulses are induced across the gaps 24 between two or more relative position switch halves, or electrodes. The three trigger positions in this embodiment include a zero force point position 34, a positive displacement ($+d_0$) position 36, and a negative displacement ($-d_0$) position 38 (shown in FIGS. 4A, 4B, and 4C respectively). When the first and second oscillators 14 and 16 are aligned in the positive displacement position 36, the zero force point position 34, or the negative displacement position 38, tunneling discharge current pulses 40, 42, and 44 are induced respectively. The tunneling discharge current pulses 40, 42, and 44 may be sensed and may be amplified by low-noise current amplifiers as described in further detail with respect to FIG. 5, below.

Figure 5:
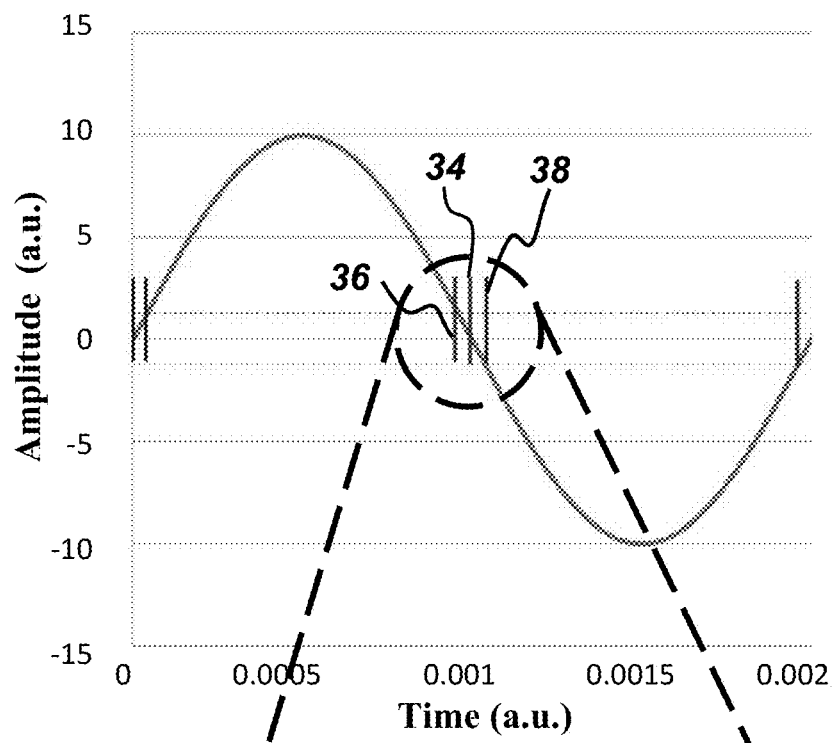
FIG. 5 is a plot of the oscillation amplitude over time of an oscillator with stacked relative position switch halves.
Figure 5:
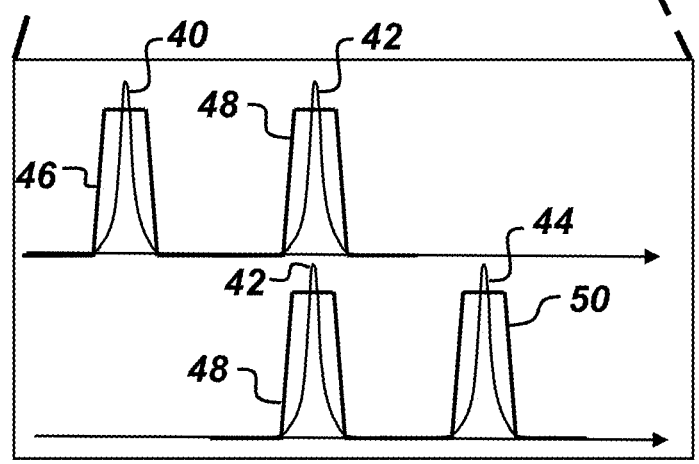

FIG. 5 shows how the tunneling discharge current pulses 40, 42, and 44 may be amplified to the rails. The width of the tunneling discharge pulse can be of very short duration due to the exponential behavior of the quantum tunneling effect given by Equation 3:

$$I = KUe^{-\beta d}$$ (Eqn. 3)

where:
I is output current;
U is the applied tunneling bias voltage;
d is the tunneling gap width;
K is a constant describing density of available states both source and destination; and
β is a constant describing the electron work function or the energy that is required to free an electron to vacuum potential.

This very short impulse helps to precisely pinpoint the exact moment in time the first oscillator 14 passes the zero force point reference position 34, illustrated in FIG. 4A. As the pulses may differ in amplitude due to, for example, variations in applied tunneling voltage (voltage noise) and/or tunneling distance, low noise current amplifiers may be used to amplify the discharge current pulses 40, 42, and 44 to the rail (that is the maximum current level value of the sensing circuit) so as to produce the amplified pulses 46, 48, and 50, which exhibit substantially rectangular shapes. Although the amplitude information is lost, the amplified square pulses are advantageously well suited for interfacing with digital circuits and/or yet other more sophisticated devices such as digital signal processors.

Figure 6A:
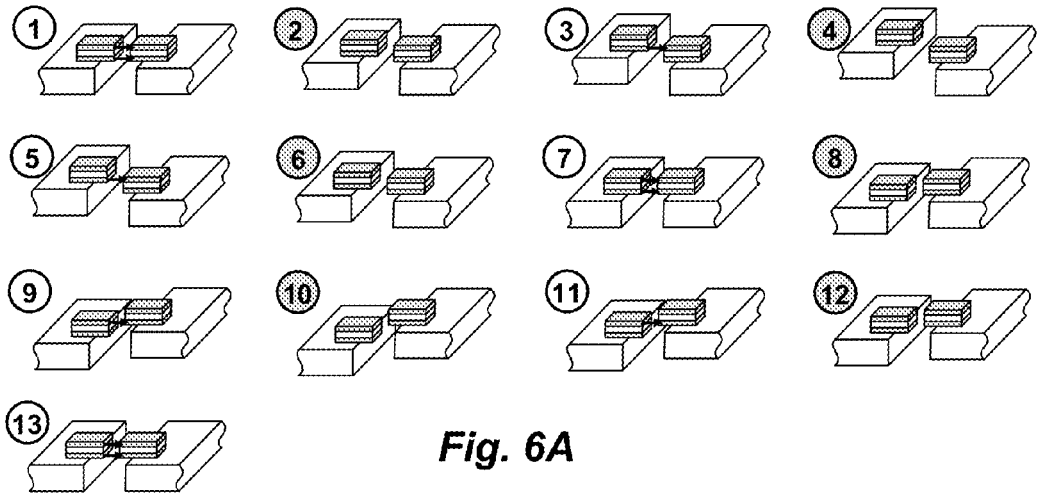
FIG. 6A is an illustration showing various relative positions of two oscillators during the oscillation of one of the oscillators.
Figure 6B:
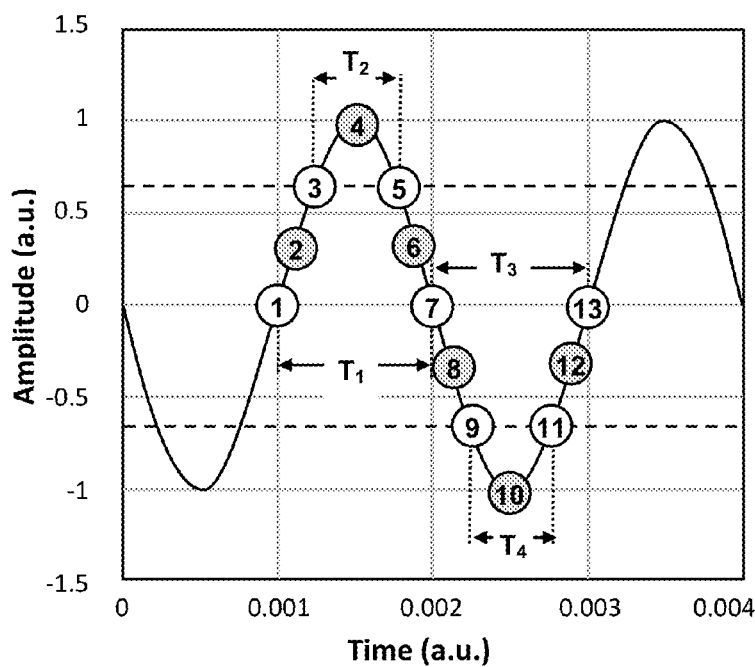
FIG. 6B is a plot of the oscillation amplitude over time of the resonator depicted in FIG. 6A.

FIGS. 6A-6B illustrate an exemplary sequence of a tunneling pulse generation for the embodiment of resonator 10 shown in FIGS. 4A-4C. This sequence comprises one complete cycle of oscillation of the first oscillator 14. The position-indicator circles with white backgrounds 1, 3, 5, 7, 9, 11, and 13 in FIGS. 6A and 6B indicate the tip positions where a conducting path is established for current flow (i.e., trigger positions 34, 36, and 38), which may be equated to instances of logical "1s." The position indicator circles with shaded backgrounds 2, 4, 6, 8, 10, and 12 correspond to positions where there is no conducting current, which may be equated to instances of logical "0s." When the oscillator 14 is in the zero force position 34 (e.g., positions 1, 7, and 13) both relative position switches are aligned, hence causing current pulses 42 between relative position switch halves 18 and 20 and between switch halves 26 and 28. When the oscillator 14 is in the positive displacement position 36 (denoted with the designators 3 and 5), the current pulse 40 is generated between the first relative position switch half 18 and the fourth relative position switch half 28. Similarly, when the oscillator 14 is in the negative displacement position 38 (denoted with the designators 9 and 11), the current pulse 44 is generated between the third relative position switch half 26 and the second relative position switch half 20. When the oscillator 14 is in the positions denoted with the designators 2, 4, 6, 8, 10, and 12, no current pulses are generated by the relative position switches.

Figure 7:
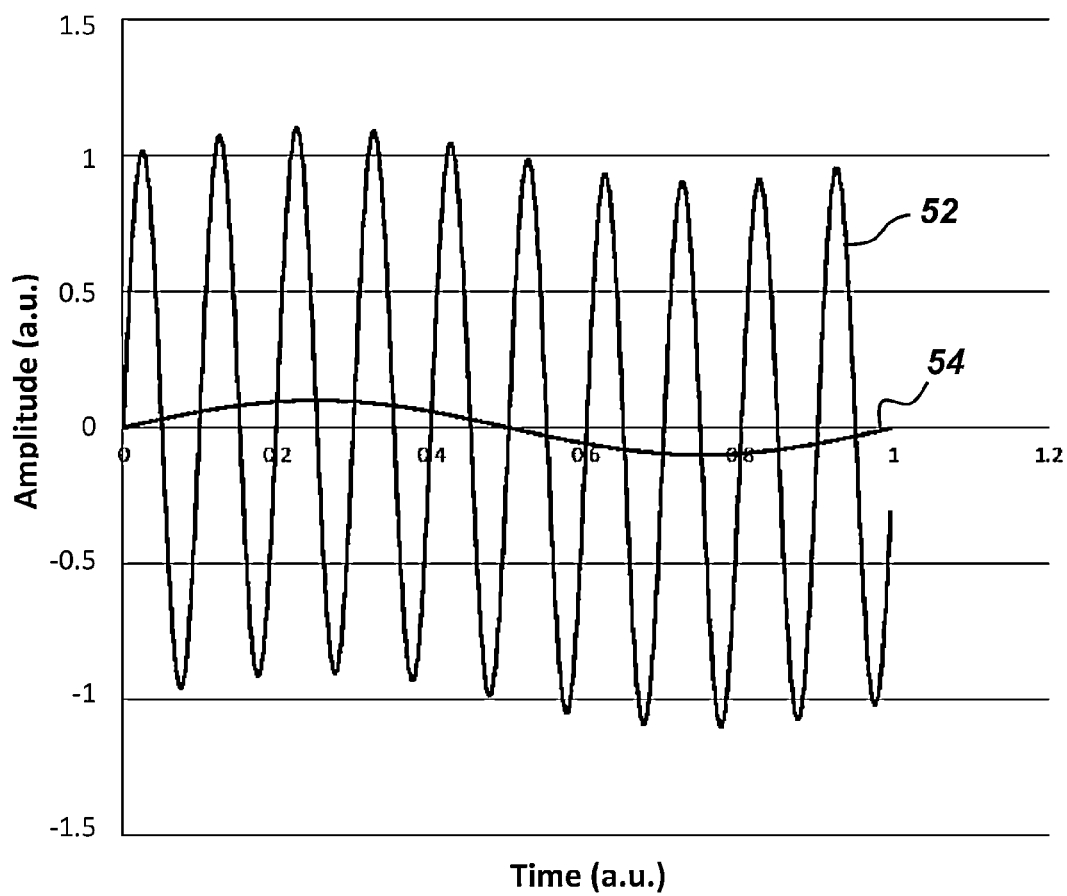
FIG. 7 is a plot of the oscillation amplitude over time of one embodiment of a dual-oscillator resonator.
Figure 8:
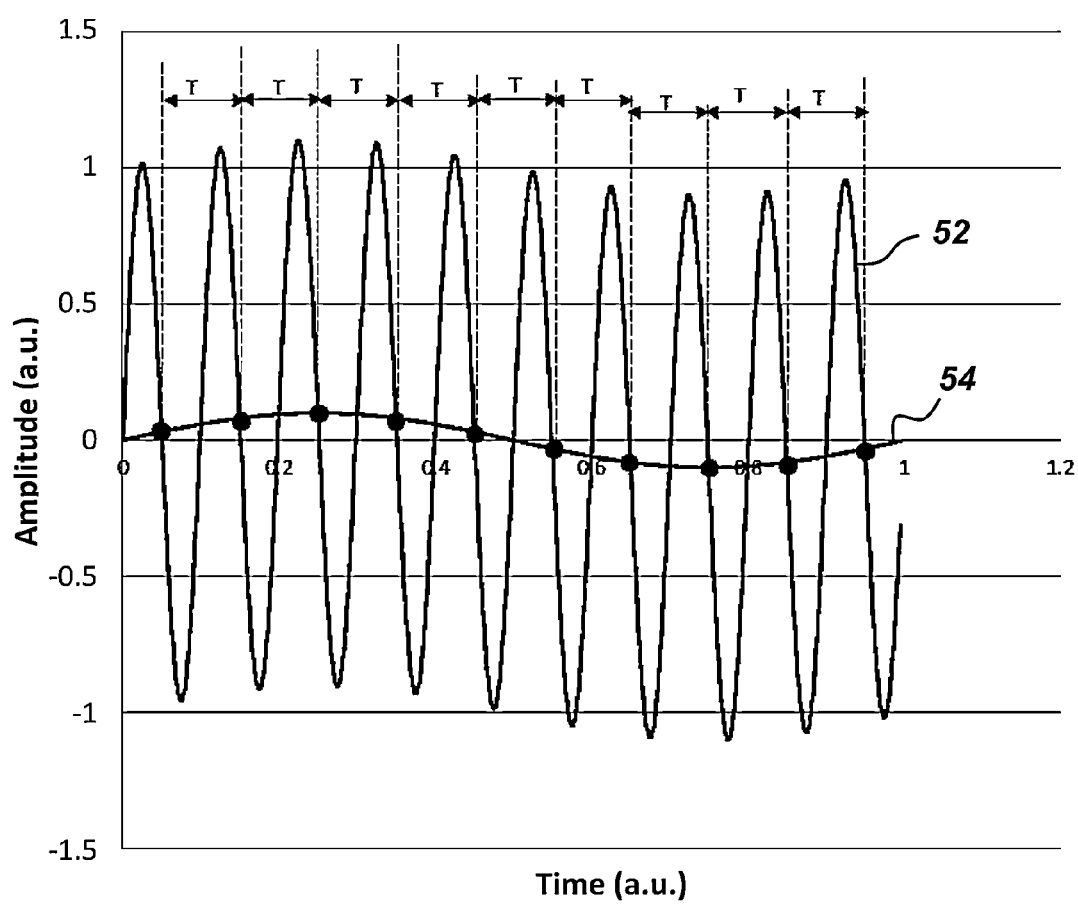
FIG. 8 is a plot of the oscillation amplitude over time of another embodiment of a dual-oscillator resonator.

FIGS. 7-8 are plots of the oscillation amplitude over time of the first and second oscillators 14 and 16 wherein the first oscillator 14 is driven on resonance and the second oscillator 16 is not driven. Trace 52 represents the oscillation of the first oscillator 14. Trace 54 represents the oscillation of the second oscillator 16. FIG. 7 shows how the first and second oscillators 14 and 16 respond similarly to an external perturbation. FIG. 8 shows that the crossing points of the first and second oscillators 14 and 16 always results in substantially the same measured time period, T.

Figure 9:
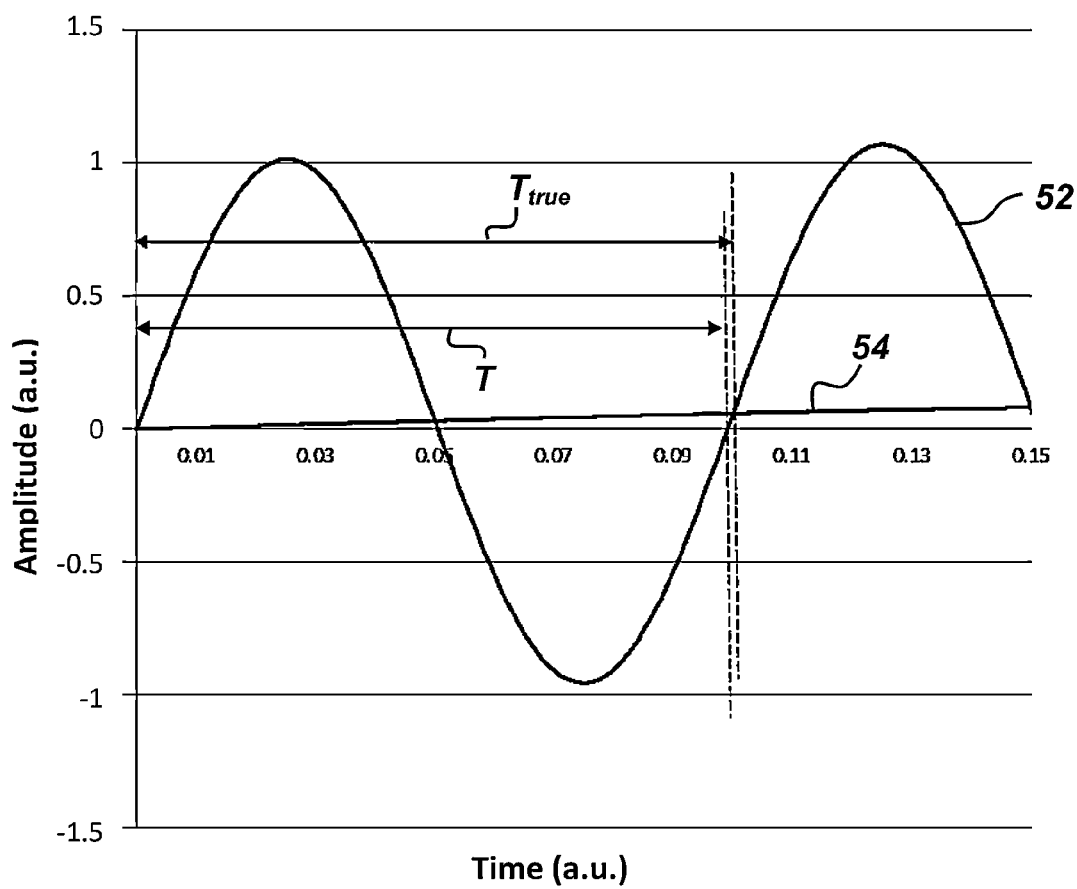
FIG. 9 is a plot of the oscillation amplitude over time of another embodiment of a dual-oscillator resonator.

FIG. 9 is a plot of the oscillation amplitude over time of the first and second oscillators 14 and 16. This figure shows that when the period, T, of the first oscillator 14 is measured with respect to the frame 12 an error in measured period occurs. The true period, $T_{true}$, is given be the crossings of the two oscillators.

In one embodiment of the resonator 10, the driving frequency $f_{drv}$ is configured to match the natural resonance frequency $f_0$ of the first oscillator 14 causing a sinusoidal motion of the first oscillator 14, as shown in FIGS. 7-9. A system driven-in-resonance typically requires a high-quality factor (Q) oscillating proof-mass system. It will be appreciated, however, that for this embodiment, literally any driving signal that maintains the oscillator in resonance may be used. In another embodiment (not shown), the first oscillator 14 is driven "off-resonance", which provides, inter alia, precise control of the oscillation period and, hence, control of sensor accuracy. Off-resonance driven systems typically require a lower Q oscillator. Non-harmonic embodiments of the first and second oscillators 14 and 16 may also be used with this invention as long as they are driven at the same frequency and out of phase with one another.

Figure 10:
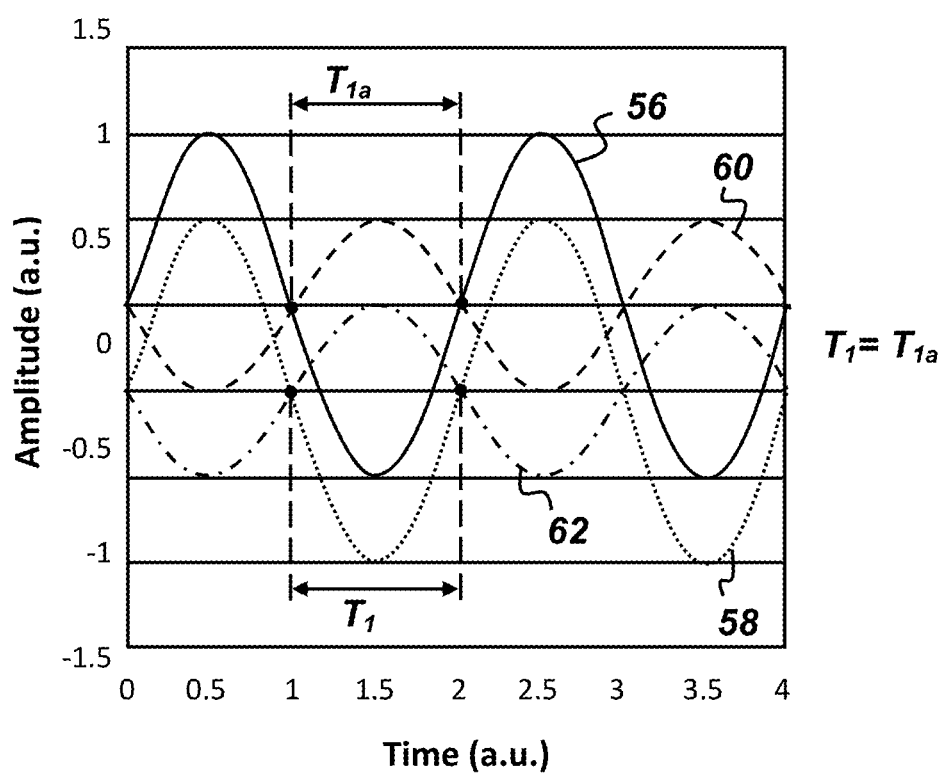
FIG. 10 is a plot of the oscillation amplitude over time of another embodiment of a dual-oscillator resonator.

FIG. 10 is a plot showing the oscillations of the first and second oscillators 14 and 16 with and without applied external acceleration. The oscillation amplitude over time of the first oscillator 14 when the frame 12 is subject to applied external acceleration is represented by the solid trace 56. The oscillation amplitude over time of the first oscillator 14 without applied external acceleration to the frame 12 is represented by the dotted line 58. The oscillation amplitude over time of the second oscillator 16 when the frame 12 is subject to applied external acceleration is represented by the sinusoidal dashed line 60. The oscillation amplitude over time of the second oscillator 16 without applied external acceleration to the frame 12 is represented by the dotted-dashed line 62. The period, $T_{1a}$, represents the distance between oscillation crossing points of the first and second oscillators 14 and 16 when subjected to external acceleration. The period $T_1$ represents the distance between oscillation crossing points of the first and second oscillators 14 and 16 without applied external acceleration. As can be seen from FIG. 10, $T_{1a}$ substantially equals $T_1$. Thus, the application of an external force to the resonator 10 does not substantially affect the timing between crossings. The frequency of oscillation of the first oscillator 14 and the second oscillator 16 may thus be determined by recording the time between two successive triggering events. Typical MEMS resonators are driven and sensed capacitively or with a piezoelectric transducer which means the ability to implement a phased locked loop (PLL) is dependent on the ability to accurately measure the precise phase, i.e. the amplitude of the sinusoidal charge generated from a capacitive signal or a sinusoidal voltage generated from a piezoelectric transducer. The resonator 10 has a well defined trigger between the first and second oscillators 14 and 16 at a known moment in time that is substantially independent of acceleration, as shown in FIG. 10, thus allowing the PLL to be closed more accurately and in a more robust manner than previous resonators.

Figure 11:
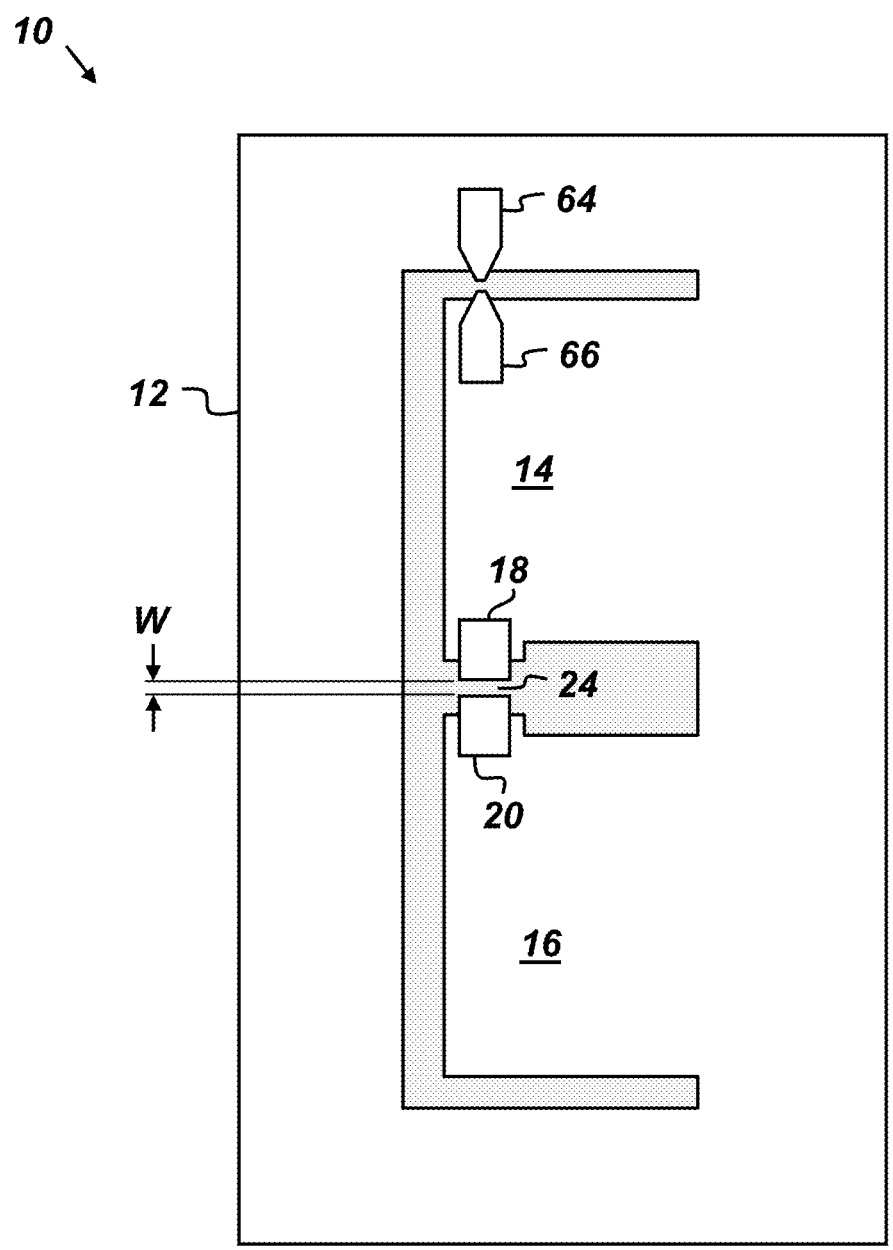
FIG. 11 is a top view of another embodiment of a dual-oscillator resonator.

FIG. 11 shows a top view of another embodiment of the resonator 10. In this embodiment, the first and second oscillators 14 and 16 are mounted to the same side of the frame 12 and the first and second relative position switch halves 18 and 20 are planar conductors having parallel edges separated from each other by the gap 24. Also shown in this embodiment are first and second absolute position switch halves 64 and 66. The first half 64 of the absolute position switch is mounted to the frame 12 and the second half 66 is mounted to the first oscillator 14. In this manner, acceleration of the frame 12 can be independently measured.

Figure 12A:
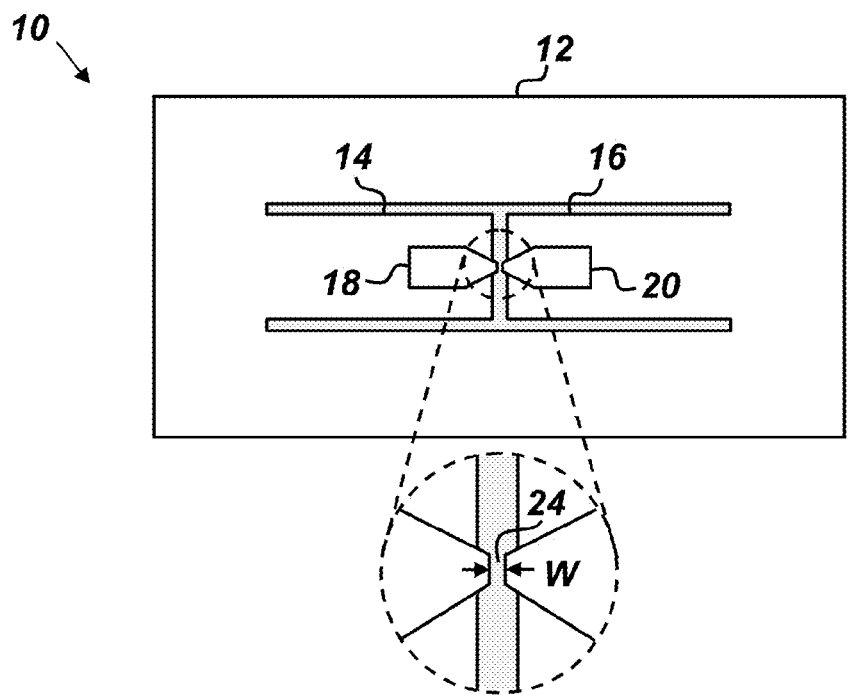
FIG. 12A is a top view of another embodiment of a dual-oscillator resonator.
Figure 12B:
FIGS. 12B-12D are side views of the embodiment of the dual-oscillator resonator depicted in FIG. 12A.
Figure 12C:
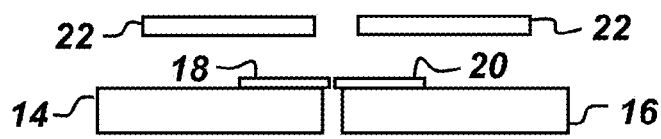
Figure 12D:

FIGS. 12A-12D show another embodiment of the resonator 10. FIG. 12A is a top view showing the first and second oscillators 14 and 16 mounted to opposite sides of the frame 12. FIGS. 12B-12D are side views of the embodiment of the resonator 10 shown in FIG. 12A which show exaggerated illustrations of the relative motion between the first and second oscillators 14 and 16. In this embodiment, both oscillators 14 and 16 are driven 180 out of phase with each other by the driver 22.

Figure 13:
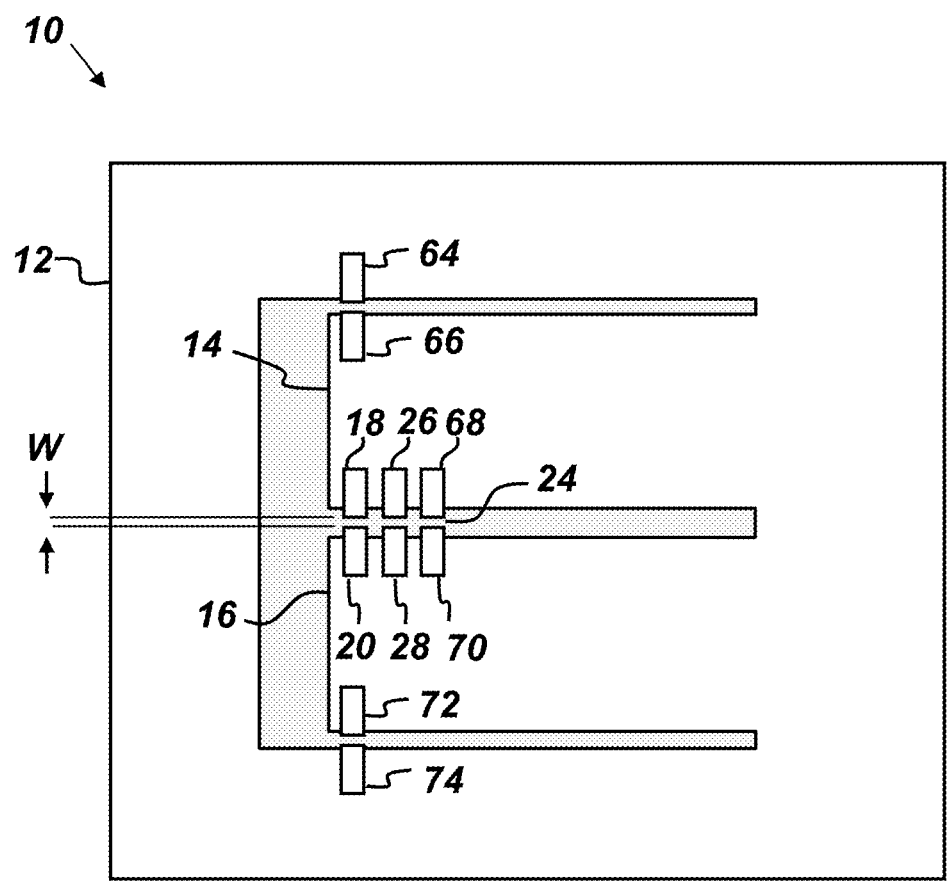
FIG. 13 is a top view of another embodiment of a dual-oscillator resonator.

FIG. 13 portrays a top view of another embodiment of the resonator 10. In this embodiment, there are three relative position switches mounted to the first and second oscillators 14 and 16. The first relative position switch comprises the first and second switch halves 18 and 20. The second relative position switch comprises the third and forth switch halves 26 and 28. The third relative position switch comprises fifth and sixth relative position switch halves 68 and 70. In this embodiment there are two absolute position switches. The first absolute position switch comprises the first and second switch halves 64 and 66. The first absolute position switch half 64 is mounted to the frame 12 and the second absolute position switch half 66 is mounted to an edge of the first oscillator 14. The second absolute position switch comprises third and fourth switch halves 72 and 74. The third absolute position switch half 72 is mounted to an edge of the second oscillator 16. The fourth absolute switch half 74 is mounted to the frame.

Figure 14A:
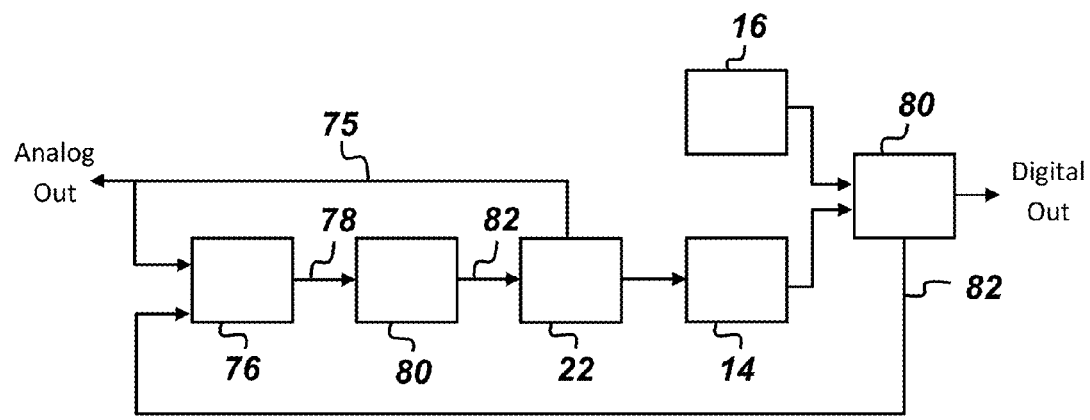
FIGS. 14A and 14B are operational block diagrams of different embodiments of a dual-oscillator resonator.
Figure 14B:
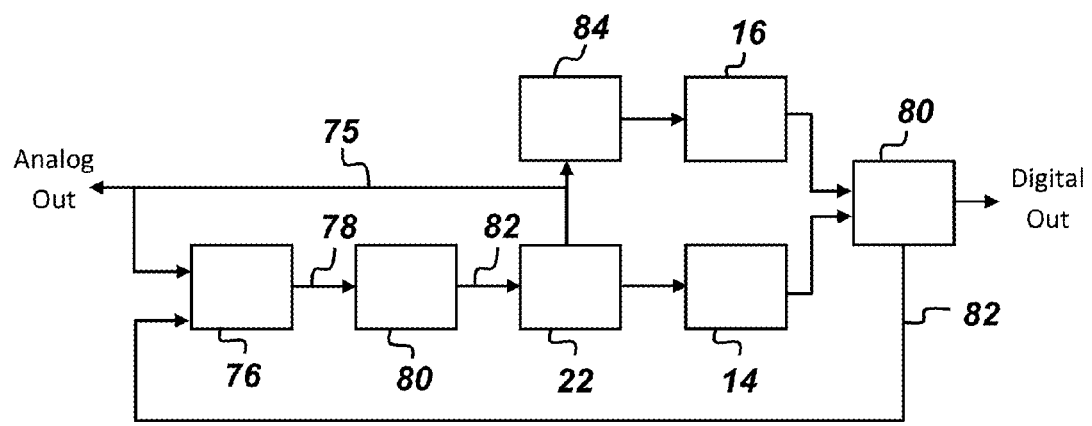

FIGS. 14A-14B are operational block diagrams of two different embodiments of the resonator 10. FIG. 14A illustrates the operation of the resonator 10 where only the first oscillator 14 is driven. In this embodiment, the driver 22 drives the first oscillator 14 and produces a voltage bias 75 as an analog output. That analog output 75 may be fed into a phase frequency detector 76 which produces an output 78. The output 78 is received by a low pass filter 80 which, in turn, produces a filtered signal 82, which is then received by the driver 22. As the first oscillator 14 oscillates, the relative position switch 80 produces a current pulse 82 during every closed state of the relative position switch 80. The current pulse 82 is a digital output which may be fed back into the frequency detector 76. FIG. 14B illustrates the operation of the embodiment of the resonator 10 where the second oscillator 16 is also driven by the driver 22. As shown in FIG. 14B, the driving output 75 is phase shifted by a phase shifter 84 before it reaches the second oscillator 16.

Figure 15A:
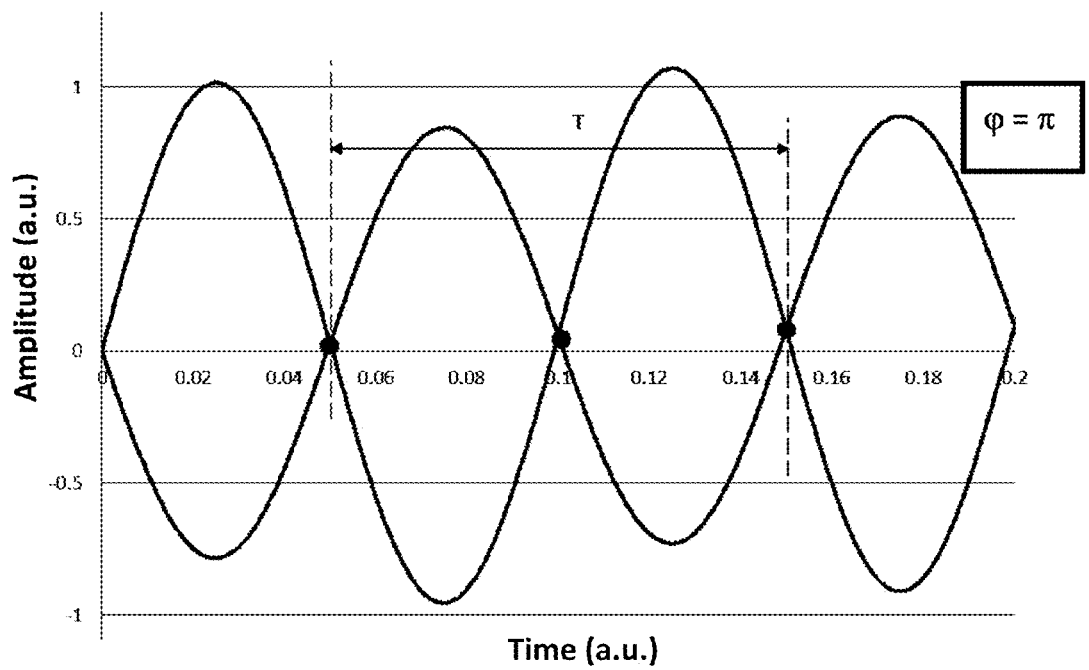
FIGS. 15A-15B are plots of the oscillation amplitudes over time of two oscillators from different embodiments of a dual-oscillator resonator.
Figure 15B:
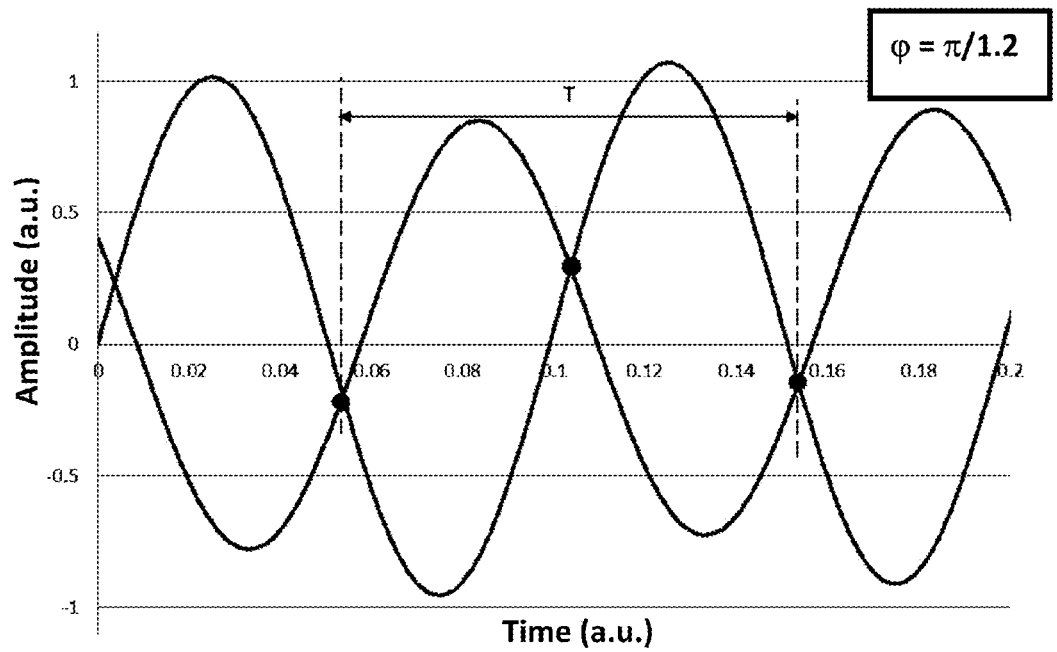
Figure 16A:
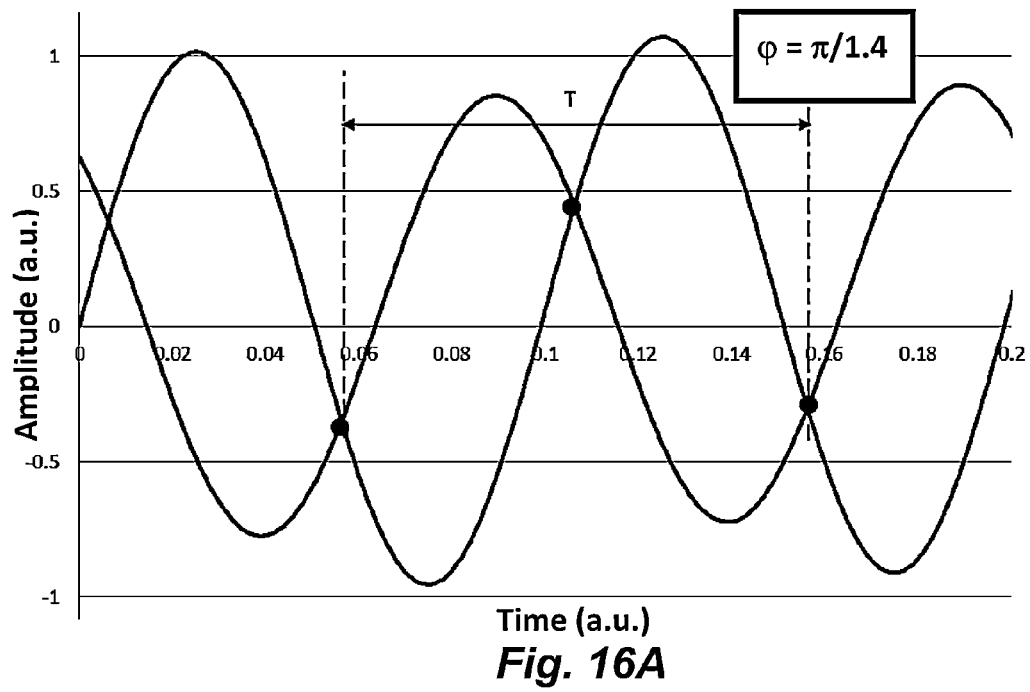
FIGS. 16A-16B are plots of the oscillation amplitudes over time of two oscillators from different embodiments of a dual-oscillator resonator.
Figure 16B:
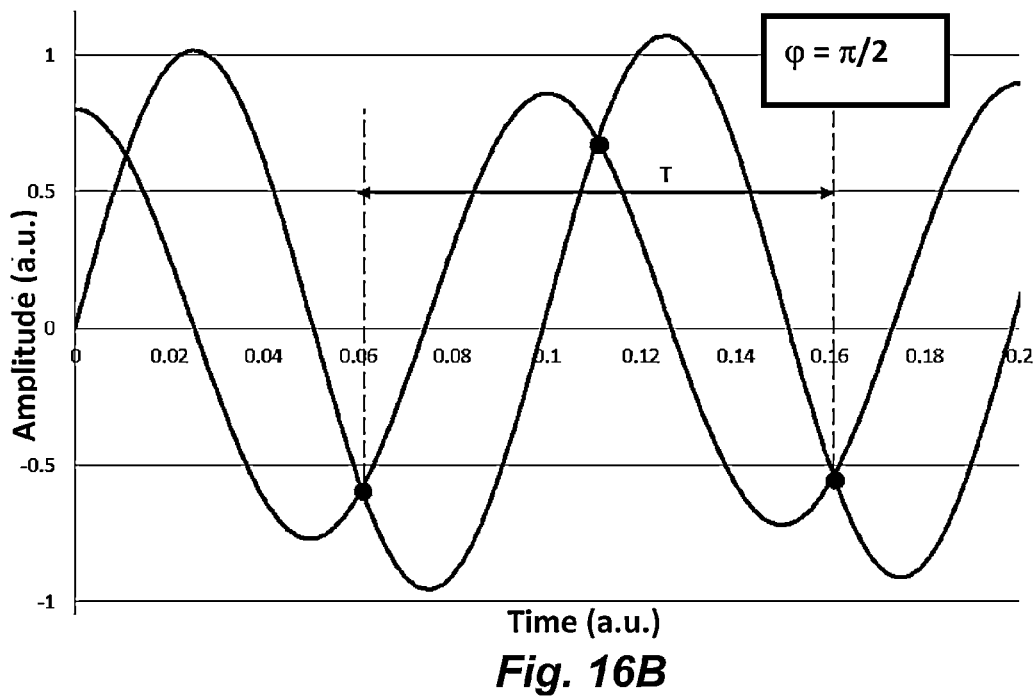
Figure 17:
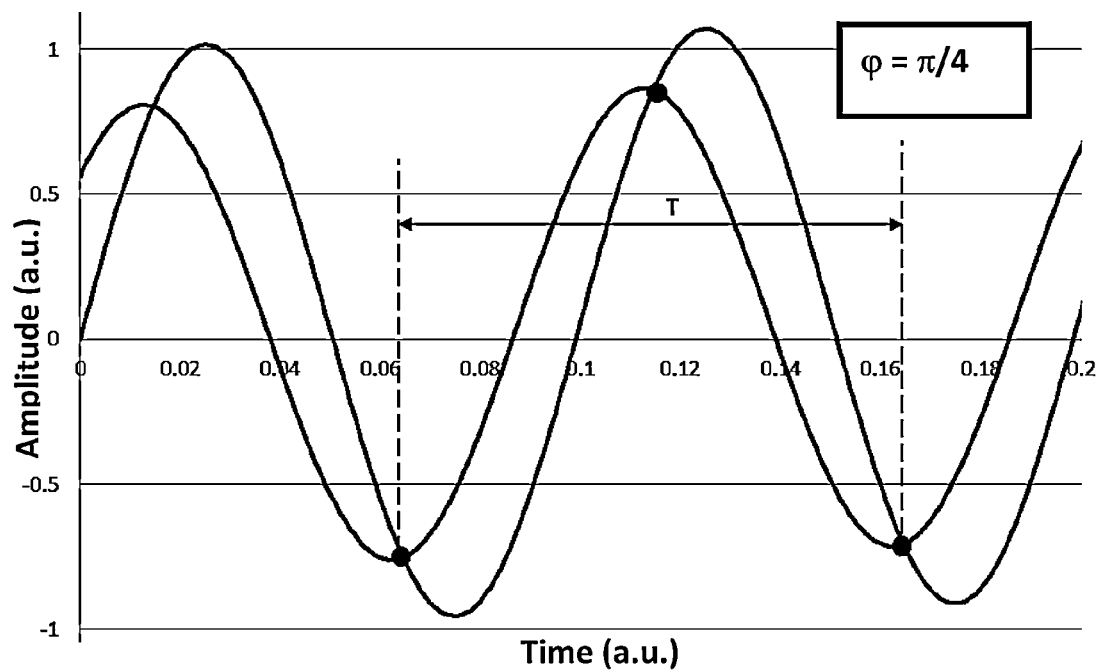
FIG. 17 is a plot of the oscillation amplitudes over time of two oscillators from an embodiment of a dual-oscillator resonator.

FIGS. 15A, 15B, 16A, 16B, and 17 show several plots of the oscillation amplitudes over time of an embodiment of the resonator 10 where both the first and second oscillators 14 and 16 are driven by the driver 22. When both oscillators are driven there does not need to be 180 degrees phase difference between them, but merely a phase difference. FIG. 15A shows the oscillations of the first and second oscillators 14 and 16 with a phase difference of it radians. FIG. 15B shows the oscillations of the first and second oscillators 14 and 16 with a phase difference of $\pi/1.2$ radians. FIG. 16A shows the oscillations of the first and second oscillators 14 and 16 with a phase difference of $\pi/1.4$ radians. FIG. 16B shows the oscillations of the first and second oscillators 14 and 16 with a phase difference of $\pi/2$ radians. FIG. 17 shows the oscillations of the first and second oscillators 14 and 16 with a phase difference of $\pi/4$ radians.

From the above description of the resonator 10 it is manifest that various techniques may be used for implementing the concepts of the resonator 10 without departing from its scope. For example, in one embodiment, the resonator 10 may be implemented as a printed circuit with no moving parts. The described embodiments are to be considered in all respects as illustrative and not restrictive. It should also be understood that the resonator 10 is not limited to the particular embodiments described herein, but is capable of many embodiments without departing from the scope of the claims.

What is claimed is:

1. A resonator comprising:
   a frame;
   a first oscillator configured to oscillate with respect to the frame;
   a first driver configured to drive the first oscillator at the first oscillator's resonant frequency;
   a first half of a first relative position switch mounted to the first oscillator;
   a second oscillator having substantially the same resonant frequency as the first oscillator, wherein the first and second oscillators are designed to respond in substantially the same manner to external perturbations to the frame;
   a second half of the first relative position switch mounted to the second oscillator; and
   wherein as the first oscillator oscillates there is relative motion between the first and second oscillators such that the first relative position switch passes through a closed state in each oscillation when the first and second switch halves of the first relative position switch pass by each other.

2. The resonator of claim 1, further comprising a second driver configured to drive the second oscillator at the second oscillator's resonant frequency and out of phase with the first oscillator.

3. The resonator of claim 1, wherein the second oscillator is not driven.

4. The resonator of claim 1, wherein the first relative position switch is configured to pass an electrical impulse when in its closed state during each oscillation.

5. The resonator of claim 4, wherein the first and second halves of the first relative position switch comprise planar conductors.

6. The resonator of claim 5, wherein the planar conductors each comprise a substantially straight edge and wherein the edges are substantially parallel, and wherein when the first relative position switch is in the closed state, the edges are separated from each other by a narrow gap.

7. The resonator of claim 6, wherein the first relative position switch comprises electron tunneling tips.

8. The resonator of claim 1, wherein the first relative position switch is a capacitive switch.

9. The resonator of claim 1, wherein the first relative position switch is an optical switch.

10. The resonator of claim 1, wherein the first relative position switch is configured to produce a binary change of an electrical signal when in its closed state during each oscillation such that the output of the resonator is a digital signal.

11. The resonator of claim 1, wherein the first driver comprises an electrode operatively coupled to the first oscillator.

12. The resonator of claim 1, wherein the first driver comprises feedback circuitry configured to generate an electrical signal to maintain operation on resonance.

13. The resonator of claim 1, wherein the first driver comprises a piezoelectric traducer configured to drive the first oscillator.

14. The resonator of claim 1, further comprising an absolute position switch comprising first and second halves, wherein the first half of the absolute position switch is mounted to the first oscillator and the second half of the absolute position switch is mounted to the frame such that the absolute position switch passes through a closed state during each oscillation of the first oscillator.

15. The resonator of claim 1, further comprising a second relative position switch having first and second halves, wherein the first and second halves of the second relative position switch are disposed above the first and second halves of the first relative position switch respectively such that a current may pass from any given relative position switch half on the first oscillator to any of the relative position switch halves on the second oscillator to which the given relative position switch half is aligned.

16. A method for providing a resonator with a time domain switch comprising the following steps:
   providing a frame;
   configuring a first oscillator to oscillate with respect to the frame;
   driving the first oscillator at the first oscillator's resonant frequency;
   mounting a first half of a relative position switch to the first oscillator;

providing a second oscillator having substantially the same resonant frequency as the first oscillator, wherein the first and second oscillators are designed to respond in substantially the same manner to external perturbations to the frame, and wherein when the first oscillator oscillates there is relative motion between the first and second oscillators; and mounting a second half of the relative position switch to the second oscillator such that as the first and second switch halves pass by each other in each oscillation the relative position switch passes through a closed state; and determining a period of oscillation as the difference between successive closed states of the relative position switch.

17. The method of claim 16, further comprising the step of driving the second oscillator to oscillate at the second oscillator's resonant frequency out of phase with the first oscillator.

18. The method of claim 16, further comprising the step of mounting an absolute position switch to the first oscillator and the frame such that the absolute position switch passes through a closed state during each oscillation of the first oscillator.

19. The method of claim 18, further comprising the step of determining a time-varying acceleration based on an output of the absolute position switch and compensating the oscillation period for skew based on the time-varying acceleration.

* * * * *